US 6,281,748 B1

(12) United States Patent
Klomsdorf et al.

(10) Patent No.: US 6,281,748 B1
(45) Date of Patent: Aug. 28, 2001

(54) METHOD OF AND APPARATUS FOR MODULATION DEPENDENT SIGNAL AMPLIFICATION

(75) Inventors: Armin Klomsdorf, Wildwood; Luke Winkelmann, Mundelein; Dale Gerard Schwent, Schaumburg; Matthew Greene, Crystal Lake, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/483,331

(22) Filed: Jan. 14, 2000

(51) Int. Cl.[7] .................................................... H03G 3/20
(52) U.S. Cl. .................... 330/129; 330/284; 330/285; 375/296; 455/127
(58) Field of Search ........................ 330/51, 129, 284, 330/285; 375/296, 297; 455/127, 552, 553

(56) References Cited

U.S. PATENT DOCUMENTS

| | | |
|---|---|---|
| 4,227,156 | 10/1980 | Mattfeld . |
| 4,567,446 * | 1/1986 | Konishi ................................. 330/308 |
| 4,763,082 | 8/1988 | Reuschle . |
| 4,823,094 | 4/1989 | Reiffin . |
| 4,985,686 | 1/1991 | Davidson et al. . |
| 5,032,801 | 7/1991 | Woo et al. . |
| 5,060,294 | 10/1991 | Schwent et al. . |
| 5,126,688 * | 6/1992 | Nakanishi et al. .................... 330/285 |
| 5,170,496 | 12/1992 | Viereck . |
| 5,182,527 * | 1/1993 | Nakanishi et al. .................... 330/285 |
| 5,204,637 * | 4/1993 | Trinh .................................... 330/129 |
| 5,276,912 | 1/1994 | Siwiak et al. . |
| 5,291,516 | 3/1994 | Dixon et al. . |
| 5,339,041 | 8/1994 | Nitardy . |
| 5,361,403 | 11/1994 | Dent . |
| 5,371,354 * | 12/1994 | Domon et al. ........................ 250/214 |
| 5,402,138 | 3/1995 | Hulett et al. . |
| 5,406,615 | 4/1995 | Miller, II et al. . |
| 5,408,691 | 4/1995 | Takao . |
| 5,438,684 | 8/1995 | Schwent et al. . |
| 5,448,255 | 9/1995 | Hulett et al. . |
| 5,457,734 | 10/1995 | Eryaman et al. . |
| 5,564,086 | 10/1996 | Cygan et al. . |
| 5,673,001 | 9/1997 | Kim et al. . |
| 5,726,606 * | 3/1998 | Marland ............................... 330/302 |
| 5,745,846 * | 4/1998 | Myer et al. ........................... 455/209 |
| 5,774,017 | 6/1998 | Adar . |
| 6,091,966 * | 7/2000 | Meadows ............................. 455/553 |
| 6,188,877 * | 2/2001 | Boesch et al. ........................ 455/74 |

FOREIGN PATENT DOCUMENTS

| | | |
|---|---|---|
| 0685936A2 | 12/1995 | (EP) . |
| 0685936A3 | 8/1996 | (EP) . |

OTHER PUBLICATIONS

Rashid Osmani & Dale Schwent, "Low Power Step Efficiency Improvement Circuits", Feb. 1994, 3 pages.
Loring Wirbel & Sam Weber, "Communications Design", May 27, 1996, 4 pages.

* cited by examiner

Primary Examiner—Robert Pascal
Assistant Examiner—Henry Choe
(74) Attorney, Agent, or Firm—Paul J. Bartusiak

(57) ABSTRACT

A modulation format switch in signal communication with an amplifier, which produces a plurality of modulation format signals, and a load is described. The modulation format switch includes at least one matching network in signal communication with the amplifier and the load, where the at least one matching network capable of having a plurality of impedance values corresponding to the plurality of modulation format signals. The modulation format switch also includes a controllable element in the matching network, the controllable element capable of having more than one impedance value.

30 Claims, 2 Drawing Sheets

METHOD OF AND APPARATUS FOR MODULATION DEPENDENT SIGNAL AMPLIFICATION

FIELD OF THE INVENTION

This invention generally relates to power amplification systems for wireless telecommunications and more particularly to systems and methods that allow wireless systems to operate with multiple modes and/or modulations.

BACKGROUND OF THE INVENTION

Within the last decade the use of wireless communications systems, such as cellular telephones, has increased at very rapid rate and today most countries around the world have established wireless systems within their boundaries. These wireless systems vary in mode of operation from country to country (and even region to region with the same country) because of different bandwidth, power and frequency requirements. As an example in digital cellular telephone operation, the United States mostly employs digital cellular systems based on either Code Division Multiple Access (CDMA) or Time Division Multiple Access (TDMA) modes of operation while Western Europe generally employs digital cellular systems based on the Global System for Mobile Communications (GSM) mode.

At present, there exists a need for wireless telecommunications systems that are capable of operating with multiple modes and/or modulations such as cellular telephones which can operate in a variety of systems supporting different modulation formats. As an example, a need exists for a cellular telephone that can operate in TDMA and CDMA modes of operation. However, it is appreciate by those skilled in the art that each mode presents a unique constraint on the power amplifier of the cellular telephone due to the differences in transmitted power level, post power amplifier insertion loss, and modulation-dependent linearity and efficiency requirements of each mode. Such cellular telephones pose a significant challenge to design and build because, for proper operation, the power amplifier must have differing output load-lines for each modulation format.

Proposals for solving this problem in the past included having separate power amplifiers for each modulation format, and then switching between these amplifier chains. This involves duplicated circuitry that took up more space and increased the cost of the systems. To add complexity to this problem, many future cellular telephones will need designs accommodating still more modulation formats (as new formats develop), making the engineering even more challenging.

U.S. Pat. No. 5,060,294 ('294), issued to Schwent et al., discloses a means for altering the load characteristics on a power amplifier to either cause amplifier saturation or prevent amplifier saturation. However, in the future cellular telephones will have the ability to operate in multiple linear modes such as linear TDMA (e.g. employing phase shift keying modulation) and some form of CDMA. The '294 patent does not address cellular telephones that operate between different linear modulation formats.

Further, the '294 patent discloses altering a bias current of an amplifier dependent upon whether the amplifier operates in a saturated or a non-saturated mode. As stated above, the '294 patent does not discuss cellular telephones that operate between different linear modulation formats. Additionally, altering an amplifier bias current provides a first order of amplifier performance improvement. There is a need for more efficiency and/or linearity improvement.

U.S. Pat. No. 5,291,516 issued to Dixon et al. discloses a dual-mode transmitter with an adjustable output filter depending upon the mode of operation. This addresses issues such as signal splatter, radiated emissions, and radiated noise power, but it does not provide the needed performance improvements to amplifier efficiency and/or linearity.

U.S. Pat. No. 5,361,403 issued to Dent discloses an amplifier that switches between a first load impedance when the amplifier is amplifying an AM signal at a first power level and a second load impedance when the amplifier is amplifying an FM signal at a second power level. However, there is a need for cellular telephephones to operate via different linear modulation schemes. For example, these different linear modulation schemes can be different forms of digital modulation including different forms of quaternary phase shift keying (QPSK), binary phase shift keying (BPSK), and/or quadrature amplitude modulation (QAM). These different digital forms of modulation have different peak-to-average ratio characteristics that impact amplifier efficiency in specific ways.

Therefore, there exists a need for an amplifier that operates in multiple modes of operation and significantly reduces the complexity, space, and cost of manufacturing and increases amplifier performance.

DETAILED DESCRIPTION

Figure 1:
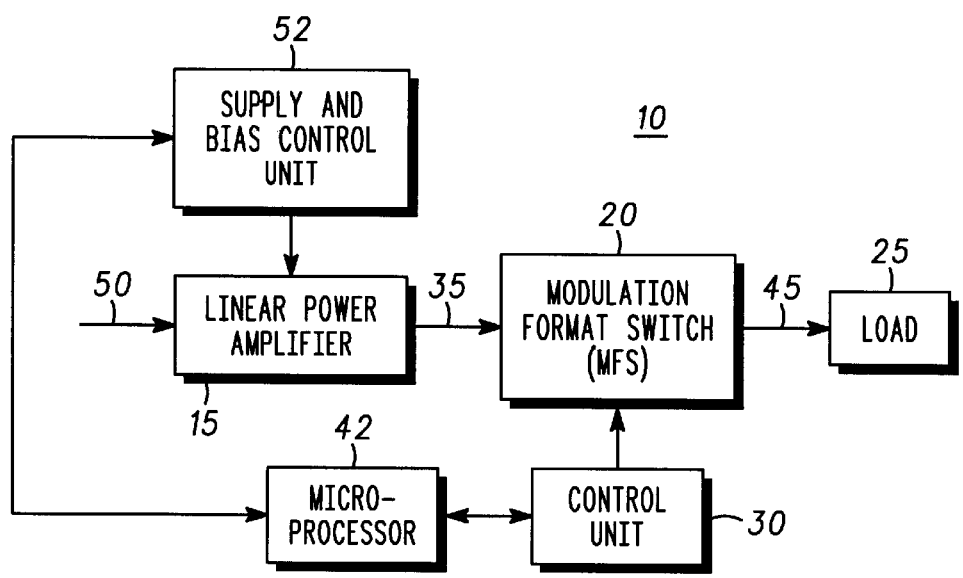
FIG. 1 is a block diagram of a portion of an example transmitter employing a modulation format switch (also referred to as a variable impedance network)

Referring to FIG. 1, an example transmitter 10 is shown. The transmitter 10 may preferably be a cellular telephone transmitter or any other wireless type transmitter capable of transmitting information in a wireless environment. It is obvious to those skilled in the art that transmitter 10 comprises other components such as filters mixers, but these elements are not shown in order to not unduly complicate the drawing figure.

The transmitter 10 includes a linear power amplifier 15, a modulation format switch (MFS) 20 (also referred to as a variable impedance network), load 25, a control unit 30, a microprocessor 42, and a supply and bias control unit 52. The linear power amplifier 15 and the control unit 30 are connected to the MFS 20 via signal connections 35 and 40 respectively. The MFS 20 is connected to the load 25 via signal connection 45.

The linear power amplifier 15 is a general solid state amplifier circuit biased for linear operation as is known in the art. The load 25 is the element for which power is delivered, and the load 25 comprises, among other things, an antenna. The MFS 20 switches the impedance values seen by the output stage of the linear power amplifier 15. It is appreciated by those skilled in the art that the different impedance values are adjusted to optimize performance of the output stage of the linear power amplifier 15 for the different modulation types such as Code Division Multiple Access (CDMA) and linear Time Division Multiple Access (TDMA). For example, the load presented to the output of an amplifier effects its operating point along a load line as is known in the art. The load impedance can thus be adjusted to increase the efficiency and/or linearity of the linear power amplifier 15. The necessary load impedance for a particular modulation format signal is predetermined experimentally.

The microprocessor 42 provides various control functions for the transmitter, such as providing control to the supply and bias control unit 52 and the control unit 30 as will be described further below. The microprocessor also determines a type of modulation of the input signal supplied to the linear power amplifier 15 so that the MFS 20 can be switched to the appropriate impedance setting. When the transmitter 10 is employed in a cellular telephone (not shown), the microprocessor 42 performs other cellular telephone control functions as is known in the art. Additionally, those skilled in the art will recognize that other processing means can be used instead of the microprocessor 42 to determine the type of modulation employed.

The control unit 30 controls the switching of the impedance values of the MFS 20 and will be described in further detail below. Additionally, the supply and bias control unit controls bias settings applied to the linear power amplifier 15 and will be described in further detail below.

Figure 2:
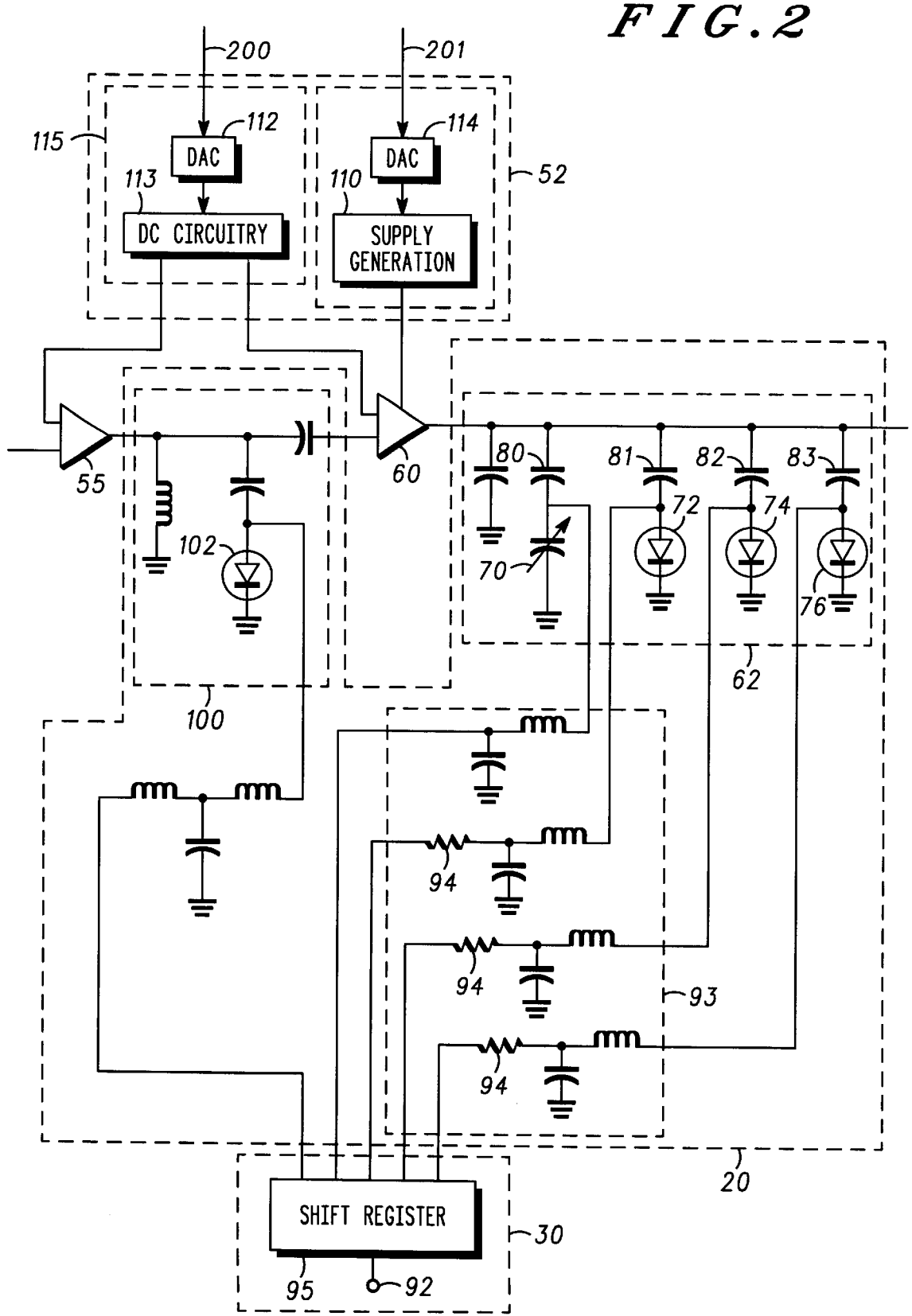
FIG. 2 shows an example implementation of the modulation format switch (MFS) block shown in FIG. 1.

FIG. 2 is an example implementation of the MFS 20. The linear power amplifier 15 includes a first stage amplifier 55 (also referred to as a driver amplifier) and a second stage amplifier 60 (also referred to as an output stage). Alternatively, the linear power amplifier 15 can be a single stage power amplifier. The MFS 20 includes a matching network 62 in signal communication with the linear power amplifier 15 and the load 25 (FIG. 1). The matching network 62 is capable of having a plurality of impedance values corresponding to the plurality of linear modulation format signals that are amplified by the linear power amplifier 15.

The matching network 62 includes a first controllable element 70, a second controllable element 72, a third controllable element 74, and a fourth controllable element 76. The first controllable element 70 is a voltage variable capacitor. An example of a voltage variable capacitor is disclosed in U.S. Pat. No. 5,137,835, filed October 1991 by Kenneth D. Cornett, E. S. Ramakrishnan, Gary H. Shapiro, Raymond M. Caldwell, and Wei-Yean Howrig, the entire patent of which is incorporated herein by reference. Another example of a voltage variable capacitor is a varactor diode as is known in the art.

The first controllable element 70 can be set to various capacitance values as a function of a supply potential. The supply potential applied to the controllable element 70 is bipolar to switch the first controllable element 70 to a first capacitance and a second capacitance. Alternatively, the supply potential can have more than two states, and the first controllable element 70 can have more than two capacitance states. Capacitor 80 is a fixed capacitor that serves as either blocking capacitors and/or matching capacitors.

The second controllable element 72 is a PIN diode that switches in or out capacitor 81 at the output of the linear power amplifier 15 depending upon the modulation format. For example, when the modulation format signal results from operation in a CDMA mode, then the capacitor 81 can be switched in to serve as a shunt capacitor. Alternatively, when the modulation format signal results from operation in a linear TDMA mode, the capacitor 81 is switched out. Still further, the second controllable element 72 can be another type switching device such as a micro electromechanical switch or a field effect transistor (FET) as is known in the art. Similarly, third control element 74 and fourth control element 76 are used with capacitor 82 and capacitor 83, respectively, to further modify the impedance presented to the linear power amplifier 15.

It is appreciated to those skilled in the art that other configurations and combinations employing the various variable control elements can be envisioned. Additionally, for certain applications, the range of impedance values necessary to accommodate different modulation formats may not require as many variable control elements or may require additional variable control elements.

The control unit 30 provides control signals to the MFS 20 to control the variable control elements. In the illustrated embodiment, the control signals are bipolar signals generated by a shift register 95. In an alternate embodiment, the control signals are not generated by a shift register, and the control signal for any variable control element may assume a plurality of discrete or continuous values. In the illustrated embodiment, the shift register 95 is supplied with a format switch serial control word generated by the microprocessor 42 (FIG. 1). Alternatively, the control word may be generated by other circuitry (not shown) that is coupled to the transmitter 10. The format switch serial control word is applied at input 92 of the control unit 30.

The MFS 20 also includes a radio frequency (RF) choke and bypass circuitry 93 to isolate the control unit 30 from the output impedance of the linear power amplifier 15 as is known in the art. The choke and bypass circuitry also includes series resistors 94 to set the proper DC bias levels for the variable control elements.

FIG. 2 shows all variable control elements being switched substantially simultaneously by the shift register 95. The switching time of the shift register 95 is negligible compared the amount of time that a particular modulation format is employed in the transmitter 10.

In a multi-modulation format wireless telephone that must efficiently and linearly amplify, for example, CDMA and linear TDMA modulated signals, the linear power amplifier 15 requires that an optimum impedance be presented to at the output of the linear power amplifier 15. The control unit 30 in combination with the MFS 20 accomplishes this by changing the impedance value of the MFS 20 for each modulation format. It is appreciated that these impedances are changed by activating the proper combination of variable control elements 70, 72, 74 and 76 with the control unit 30.

Figure 3:
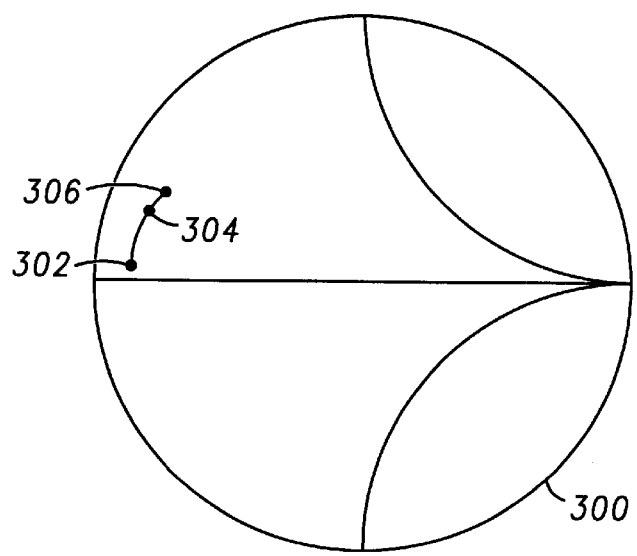
FIG. 3 shows an impedance diagram on a Smith chart for different modulation formats employed by the MFS of FIG. 2.

FIG. 3 shows on Smith Chart 300 three example impedances presented by the MFS 20 to second stage 60 of the linear power amplifier 15. These three example impedances correspond to three multiple access techniques that define three different modulation formats. For example, a first impedance 302 corresponds to a linear modulation format for a TDMA cellular telephone system such as defined by Interim Standard IS-54 or IS-136. A second impedance 304 corresponds to the linear power amplifier 15 producing the same average output power but for a second linear modulation format that is characterized by a CDMA cellular telephone system such as defined by Interim Standard IS-95. The third impedance 306 corresponds to yet a third linear modulation format which may result, for example, from a third generation wideband CDMA (WCDMA) cellular telephone air interface standard (as has been publicly disclosed and proposed in various cellular telephone standards organizations). As mentioned previously, the various impedance values corresponding to the various modulation formats are predetermined experimentally.

When the linear power amplifier 15 is a multi-stage power amplifier, the MFS 20 can optionally include an interstage matching network 100 coupled between the first stage 55 and the second stage 60. The interstage matching network 102 includes an interstage variable control element 102 for altering the impedance level between the first and second stage. Composition and operation of the interstage variable control element 102 is similar to that described for the variable control elements 70, 72, 74, and 76. The interstage matching network 100 also includes passive inductors and capacitors for RF matching purposes as is known in the art.

FIG. 2 shows that additional performance improvement can be obtained by the inclusion of the supply and bias control unit 52 coupled to the linear power amplifier 15. The supply and bias control unit 52 includes a gate bias control 115 and a supply bias control 110.

The gate bias control 115 includes a first digital-to-analog converter (DAC) 112 and a DC circuitry block 113. The DC circuitry block includes various analog circuitry for scaling and level shifting the analog signal produced by the first DAC 112.

The supply voltage control 110 includes a second DAC 114 coupled to the supply generation block 110. The supply generation block 110 can be a conventional linear regulator or a switching power supply.

The supply and bias control unit is capable of having a plurality of bias settings corresponding to the plurality of modulation format signals. For example, in the illustrated embodiment, the first stage amplifier 55 and the second stage amplifier 60 are field effect transistors (FET). The gate bias control 115 provides bias voltages to the gates of the first stage amplifier 55 and the second stage amplifier 60 to alter the respective drain currents for different modulation format signals. To accomplish this, the microprocessor 42 (FIG. 1) notes when the type of signal being amplified changes from one type of modulation format signal to another type of modulation format signal. The microprocessor 42 generates a control word that is applied to the first DAC 112 via line 200. The first DAC 112 then generates an analog signal appropriate for the new modulation format signal. The analog signal is processed by the DC circuitry 113 to produce new gate voltages for applications to the gate of the first stage amplifier 55 and the second stage amplifier 60.

In addition, the supply voltage control 110 alters the drain voltage of the second stage power amplifier 60 corresponding to the different modulation format signals. The microprocessor 42 (FIG. 1) notes a change in the type of signal being amplified from a first type of modulation signal to a second type of modulation signal (e.g. a transition from linear TDMA mode to CDMA mode). The microprocessor 42 directs the second DAC 114 via line 201 to produce a different analog signal that is applied to the supply generator 110. The supply generator then produces a new supply voltage for the drain of the second stage power amplifier 60 that is appropriate for the new type of modulation format signal being amplified.

The addition of altering bias and/or supply settings of the linear power amplifier in combination with applying different output impedances to the linear power amplifier 15 results in significant efficiency improvements over what has previously been possible.

While the specification in this invention is described in relation to certain implementations or embodiments, many details are set forth for the purpose of illustration. Thus, the foregoing merely illustrates the principles of the invention. Thus this invention may have other specific forms without departing from its spirit or essential characteristics. For example, the first stage amplifier 55 (FIG. 2)and the second stage amplifier 60 (FIG. 2) can be bipolar transistors rather than FETs. The supply and bias control unit 52 can then alter the collector voltage of the second stage amplifier 60 and/or the base currents of the first stage amplifier 55 and the second stage amplifier 60 versus the type of modulation format signal or the average output power as described previously.

We claim:

1. A modulation format switch in signal communication with an amplifier and a load, the amplifier for amplifying a plurality of linear modulation format signals distinguished by different linear modulation schemes, the modulation format switch comprising:

at least one matching network in signal communication with the amplifier and the load, the at least one matching network capable of having a plurality of impedance values corresponding to the plurality of linear modulation format signals; and a controllable element in the at least one matching network, the controllable element capable of having more than one impedance value, wherein a first linear modulation scheme of the different linear modulation schemes comprises any of Phase Shift Keying (PSK) modulation or Amplitude Modulation (AM), and additional modulation schemes comprises any of a different PSK modulation or AM.

2. The modulation format switch of claim 1 wherein the controllable element is controlled by a control unit.

3. The modulation format switch of claim 2 wherein the control unit comprises a shift register.

4. The modulation format switch of claim 2 wherein the controllable element comprises any of a PIN diode, a micro electromechanical switch, and a voltage variable capacitor.

5. The modulation format switch of claim 1 wherein the plurality of linear modulation format signals correspond to any of a plurality of multiple access techniques selected from the group consisting essentially of Code Division Multiple Access (CDMA) and linear modulation Time Division Multiple Access (TDMA).

6. The modulation format switch of claim 1 further comprising an interstage matching network in signal communication with the amplifier, the amplifier being a multiple stage amplifier having at least a first stage amplifier and second stage amplifier, and a controllable element in the interstage matching network, the controllable element in the interstage matching network capable of having more than one impedance value.

7. The modulation format switch of claim 6 further including a shunt element in the interstage matching network to change an inductive reactance of the interstage matching network.

8. The modulation format switch of claim 6 wherein the controllable element in the interstage matching network is controlled by a control unit.

9. The modulation format switch of claim 8 wherein the controllable element in the interstage matching network comprises any of a PIN diode, a micro electromechanical switch, and a voltage variable capacitor.

10. The modulation format switch of claim 6 further including a supply and bias control unit in signal communication with the amplifier.

11. The modulation format switch of claim 10 wherein the supply and bias control unit has a plurality of bias settings corresponding to the plurality of linear modulation format signals.

12. The modulation format switch of claim 10 wherein the supply and bias control unit comprises at least one of a switching power supply, a linear regulator, and a gate bias DC circuitry.

13. The modulation format switch of claim 1 wherein the at least one matching network presents different impedances to the amplifier for each of the plurality of linear modulation format signals to alter an operating load line of the amplifier in a substantially predetermined fashion.

14. The modulation format switch of claim 1 further comprising a supply and bias control unit in signal communication with the amplifier.

15. The modulation format switch of claim 14 wherein the supply and bias control unit produces a plurality of bias settings corresponding to the plurality of linear modulation format signals.

16. The modulation format switch of claim 15 wherein the at least one matching network produces a plurality of substantially predetermined impedances at a carrier frequency of operation of the amplifier, the plurality of substantially predetermined impedances corresponding to the plurality of linear modulation format signals.

17. The modulation format switch of claim 1 wherein the at least one matching network has a plurality of substantially predetermined impedances at a carrier frequency of operation of the amplifier, the plurality of substantially predetermined impedances corresponding to the plurality of linear modulation format signals.

18. A modulation format switch in signal communication with an amplifier and a load, the amplifier for amplifying a plurality of linear modulation format signals distinguished by a plurality of different linear modulation schemes, the modulation format switch comprising:

a variable impedance network in signal communication with the amplifier and the load, the variable impedance network to present a plurality of impedance values corresponding to the plurality of linear modulation format signals;

a variable impedance element in the variable impedance network, the variable impedance element capable of having more than one impedance value; and a supply and bias control unit in signal communication with the amplifier, the supply and bias control unit having a plurality of bias settings corresponding to the plurality of linear modulation format signals, wherein the variable impedance network presents a different impedance to the amplifier for each of the plurality of linear modulation format signals to alter the operating load line of the amplifier in a substantially predetermined fashion.

19. The modulation format switch as in claim 18 wherein the plurality of bias settings comprises at least one of voltage bias settings, supply voltage settings, and current bias settings of the amplifier.

20. The modulation format switch as in claim 19 wherein the amplifier comprises a field effect transistor (FET), the plurality of bias settings to control at least one of a gate voltage of the FET and a drain voltage of the FET.

21. The modulation format switch as in claim 19 wherein the amplifier comprises a bipolar transistor, the plurality of bias settings to control at least one of a base current of the bipolar transistor and a collector voltage of the bipolar transistor.

22. The modulation format switch as in claim 18 wherein the plurality of linear modulation format signals result from phase shift keying modulation.

23. An apparatus for amplifying a plurality signals distinguished by a plurality of different linear modulation formats, the apparatus comprising:

an amplifier;

a variable impedance network coupled to the amplifier, the variable impedance network to present a different impedance to the amplifier for each of the plurality of different linear modulation formats; and a bias control circuit coupled to the amplifier, the bias control circuit to present a plurality of bias settings to the amplifier, the plurality of bias settings corresponding to the plurality of different linear modulation formats.

24. The apparatus as in claim 23 wherein the plurality of bias settings comprises at least one of voltage bias settings and current bias settings of the amplifier.

25. The apparatus as in claim 24 wherein the variable impedance network comprises any of a PIN diode, a micro electromechanical switch, and a voltage variable capacitor.

26. The apparatus as in claim 23 wherein the variable impedance network produces a plurality of substantially predetermined impedances at a carrier frequency of operation of the amplifier, the plurality of substantially predetermined impedances corresponding to the plurality of different linear modulation formats.

27. The apparatus as in claim 23 further comprising:

a second amplifier coupled to an output of the first amplifier; and an interstage variable impedance network coupled between the amplifier and the second amplifier, the interstage variable impedance network having more than one impedance value.

28. The apparatus as in claim 23 wherein the variable impedance network presents each of the different impedances corresponding to each of the plurality of different linear modulation formats to alter an operating load line of the amplifier in a substantially predetermined fashion.

29. A method of amplifying a plurality of signals distinguished by a plurality of different linear modulation formats, the method comprising:

applying a first signal characterized by a first linear modulation format to an amplifier;

presenting a first impedance to an output of the amplifier responsive to the first signal;

setting a first bias condition of the amplifier responsive to the first signal;

applying a second signal characterized by a second linear modulation format to the amplifier;

presenting a second impedance to the output of the amplifier responsive to the second signal; and setting a second bias condition of the amplifier responsive to the second signal.

30. An apparatus for amplifying a plurality of modulation format signals distinguished by a plurality of different modulation formats, the apparatus comprising:

an amplifier;

a load coupled to the amplifier;

a variable impedance network in signal communication with the amplifier and the load, the variable impedance network to present a plurality of impedance values corresponding to the plurality of modulation format signals;

a variable impedance element in the variable impedance network, the variable impedance element capable of having more than one impedance value; and a supply control unit in signal communication with the amplifier, the supply control unit for applying to the amplifier a plurality of supply voltage settings corresponding to the plurality of modulation format signals.

* * * * *